(12) United States Patent
Hamaguchi et al.

(10) Patent No.: US 11,239,762 B2
(45) Date of Patent: Feb. 1, 2022

(54) POWER CONVERTER

(71) Applicant: HITACHI AUTOMOTIVE SYSTEMS, LTD., Hitachinaka (JP)

(72) Inventors: Atsunari Hamaguchi, Hitachinaka (JP); Toshiya Satoh, Hitachinaka (JP); Youhei Nishizawa, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 0 days.

(21) Appl. No.: 16/760,636

(22) PCT Filed: Oct. 23, 2018

(86) PCT No.: PCT/JP2018/039270
§ 371 (c)(1),
(2) Date: Apr. 30, 2020

(87) PCT Pub. No.: WO2019/087852
PCT Pub. Date: May 9, 2019

(65) Prior Publication Data
US 2020/0350829 A1    Nov. 5, 2020

(30) Foreign Application Priority Data

Nov. 2, 2017 (JP) .............................. JP2017-212420

(51) Int. Cl.
*H02M 7/00* (2006.01)
*H05K 5/02* (2006.01)
(Continued)

(52) U.S. Cl.
CPC .......... *H02M 7/003* (2013.01); *H05K 5/0247* (2013.01)

(58) Field of Classification Search
CPC .......... H02M 7/003; H02M 7/00; H02M 7/48; H05K 5/02; H05K 5/0247; H05K 7/02; H05K 7/04; Y02E 60/13
(Continued)

(56) References Cited

U.S. PATENT DOCUMENTS

2014/0160823 A1* 6/2014 Uetake ................. H02M 7/003
363/141
2014/0362573 A1* 12/2014 Imai ......................... F21K 9/23
362/247
(Continued)

FOREIGN PATENT DOCUMENTS

JP     2008061282 A  *  3/2008  ............. H01G 4/224
JP     2011-233795 A    11/2011
(Continued)

OTHER PUBLICATIONS

International Search Report with English translation and Written Opinion issued in corresponding application No. PCT/JP2018/039270 dated Jan. 22, 2019.

*Primary Examiner* — Timothy J Thompson
*Assistant Examiner* — Guillermo J Egoavil
(74) *Attorney, Agent, or Firm* — Foley & Lardner LLP

(57) ABSTRACT

An object of the present invention is to ensure the reliability of a capacitor element by appropriately securing a heat path around the capacitor element.
A power converter according to the present invention includes: a power semiconductor circuit unit that converts DC power into AC power; a capacitor element that smooths the DC power; a DC-side bus bar that transmits the DC power; a capacitor terminal that is connected to an electrode surface of the capacitor element and to the DC-side bus bar; and a case that forms a capacitor housing portion for housing the capacitor element, in which the DC-side bus bar has: a power supply-side terminal; a main body portion that is
(Continued)

arranged at a position facing a bottom of the capacitor housing portion with the capacitor element interposed therebetween; and an extending member that is formed between the case and the capacitor element and formed from the main body portion toward the bottom of the capacitor housing portion, and that does not contact the electrode surface.

7 Claims, 14 Drawing Sheets

(51) Int. Cl.
    *H05K 7/02*         (2006.01)
    *H05K 7/04*         (2006.01)

(58) Field of Classification Search
    USPC .......................................................... 361/807
    See application file for complete search history.

(56) References Cited

U.S. PATENT DOCUMENTS

2016/0374229 A1* 12/2016 Nishikimi .............. H05K 7/209
2017/0169948 A1* 6/2017 Zhang ...................... H01G 4/38

FOREIGN PATENT DOCUMENTS

| JP | 2013-059191 A | 3/2013 | | |
|---|---|---|---|---|
| JP | 2015-126674 A | 7/2015 | | |
| JP | 2017-017861 A | 1/2017 | | |
| JP | 2017017861 A | * 1/2017 | .............. | H02M 7/48 |

\* cited by examiner

POWER CONVERTER

TECHNICAL FIELD

The present invention relates to a power converter, and more particularly to a power converter for a hybrid vehicle or an electric vehicle.

BACKGROUND ART

In the main circuit and capacitor module of an inverter mounted on a hybrid vehicle or electric vehicle, a configuration is adopted, in which a power semiconductor circuit unit that performs an operation of converting DC power into AC power is connected by a bus bar to which a capacitor that smooths DC power is connected.

PTL 1 describes that: a bus bar connected to a power semiconductor circuit unit that performs an operation of converting DC power to AC power needs to be electrically connected also to a smoothing capacitor; and the bus bar is extended to the electrode surface of a capacitor element to be connected to the electrode surface.

However, the bus bar is a heat-generating component, while the capacitor element needs to be provided with heat measures, such as heat dissipation and heat shielding, against the exothermic temperature of the bus bar.

CITATION LIST

Patent Literature

PTL 1: JP 2011-233795 A

SUMMARY OF INVENTION

Technical Problem

An object of the present invention is to ensure the reliability of a capacitor element by appropriately securing a heat path around the capacitor element.

Solution to Problem

A power converter according to the present invention includes: a power semiconductor circuit unit that converts DC power into AC power; a capacitor element that smooths the DC power; a DC-side bus bar that transmits the DC power; a capacitor terminal that is connected to an electrode surface of the capacitor element and to the DC-side bus bar; and a case that forms a capacitor housing portion for housing the capacitor element, in which the DC-side bus bar has: a power supply-side terminal; a main body portion that is arranged at a position facing a bottom of the capacitor housing portion with the capacitor element interposed therebetween; and an extending member that is formed between the case and the capacitor element and formed from the main body portion toward the bottom of the capacitor housing portion, and that does not contact the electrode surface.

Advantageous Effects of Invention

According to the present invention, the reliability of the capacitor element can be improved.

DESCRIPTION OF EMBODIMENTS

Figure 1:
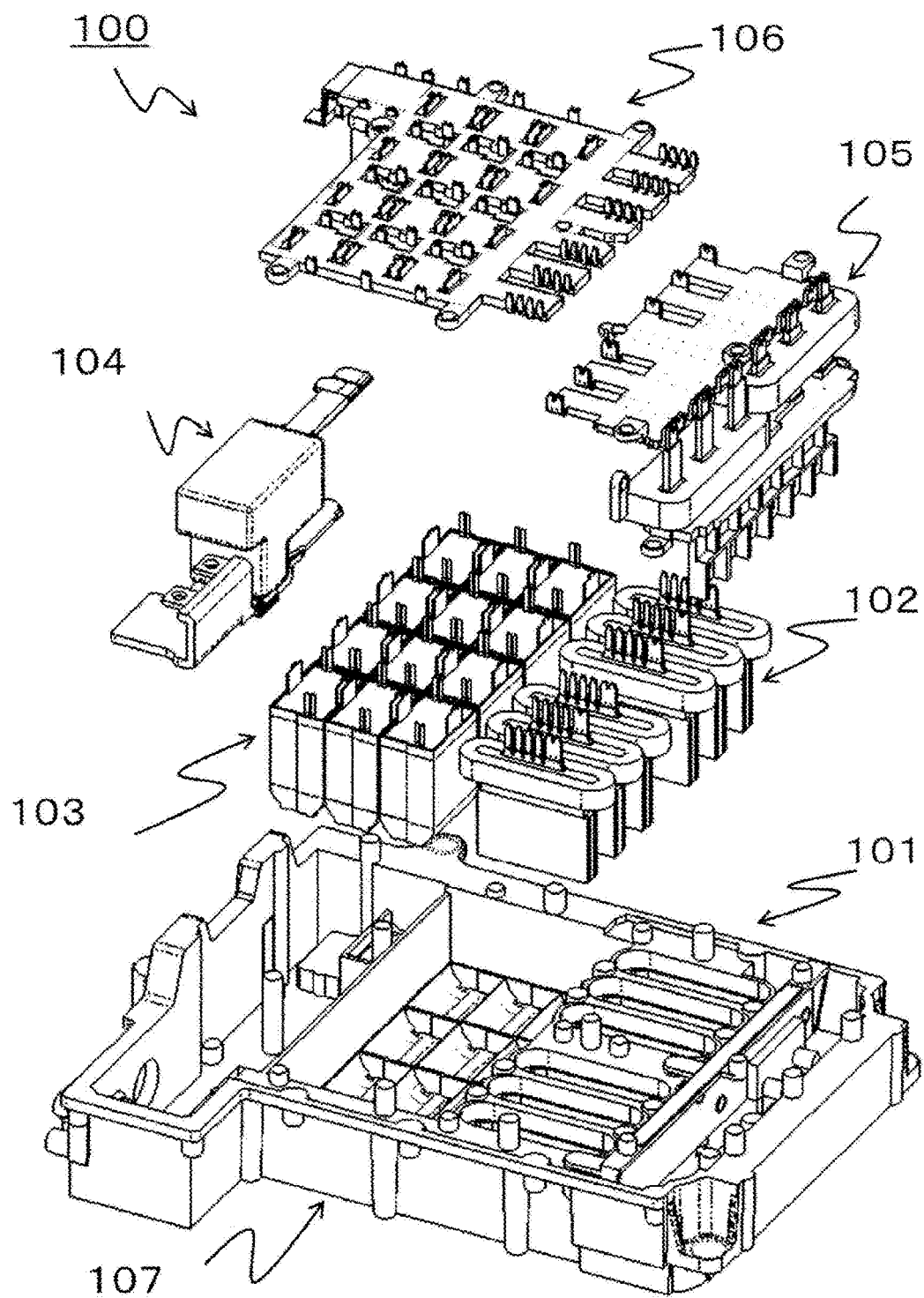
FIG. 1 is a development view of a power converter 100 according to the present embodiment.

Hereinafter, embodiments of a power converter according to the present invention will be described with reference to the drawings. In each of the drawings, the same elements are denoted by the same reference numerals, and redundant description will be omitted. The present invention is not limited to the following embodiments, and includes various modifications and application examples within the technical concept of the present invention.

FIG. 1 is a development view of a power converter 100 according to the present embodiment.

The power converter 100 is a power converter for large power that converts DC power from a battery into AC power, and in the present embodiment, that supplies AC power particularly to a vehicle drive motor.

A housing 101 is made of metal, for example, an aluminum alloy, and is a box-shaped rectangular parallelepiped having a pair of short side walls and a pair of long side walls. The housing 101 houses a power semiconductor circuit unit 102, a smoothing capacitor 103, a power supply-side terminal 104, an AC-side bus bar 105, a DC-side bus bar 106, and the like. The case bottom surface opposite to the opening surface of the housing 101 is a cooling surface.

The smoothing capacitor 103 absorbs a current change due to switching of the power semiconductor circuit unit 102 in order to stabilize an output.

The power supply-side terminal 104 is an input-side terminal and is connected to the battery. The AC-side bus bar 105 is an output-side terminal and is connected to the motor.

The DC-side bus bar 106 connects the power supply-side terminal 104 and the AC-side bus bar 105 and connects an input to an output. The DC-side bus bar 106 is also electrically connected to the smoothing capacitor 103. The DC-side bus bar 106 through which a large current flows becomes a heating element, and the heat reaches a cooling surface 107, or the bottom surface of the housing 101, via the smoothing capacitor. When reaching the cooling surface 107 from the DC-side bus bar 106, the heat passes through the smoothing capacitor 103, so that the temperature of the smoothing capacitor 103 rises and is thermally affected.

Figure 2:
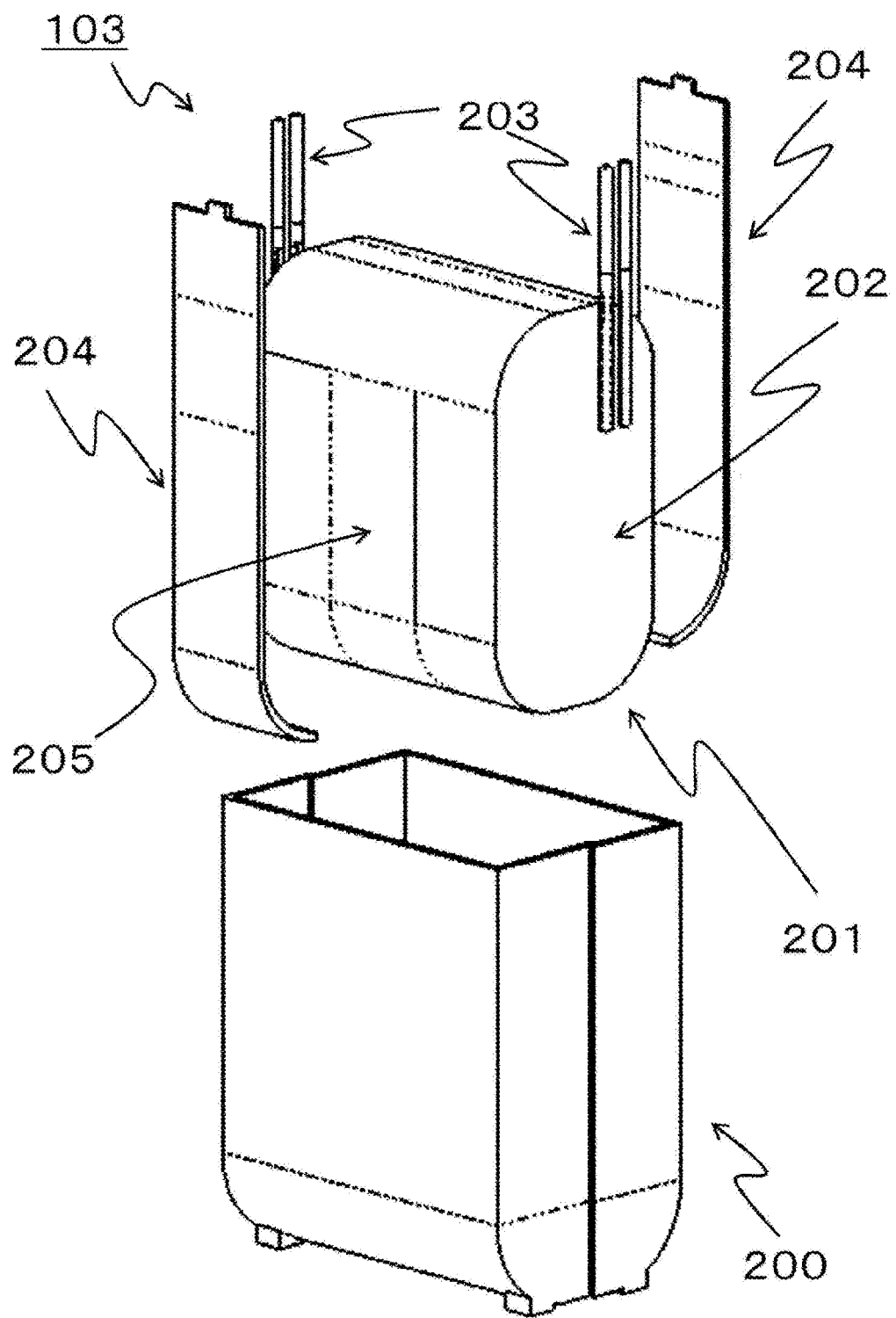
FIG. 2 is a development view of a smoothing capacitor 103 according to the present embodiment.

FIG. 2 is a development view of the smoothing capacitor 103 according to the present embodiment.

A capacitor case 200 is made of resin, and houses a capacitor element 201, an extending member 204, and a non-illustrated epoxy resin. The epoxy resin seals the capacitor element 201 and the extending member 204.

A capacitor terminal 203 is welded to an element electrode surface 202 of the capacitor element 201.

The capacitor element 201 is made of a polypropylene film. Therefore, the allowable temperature of the capacitor element 201 is, for example, 105° C. When the temperature of the capacitor element 201 becomes 105° C. or higher, the security mechanism of the capacitor deteriorates and a short-circuit mode may be created.

The capacitor terminal 203 is connected to the DC-side bus bar 106 (see FIG. 1) above the opening surface of the capacitor case 200.

The DC-side bus bar 106 through which a large current flows becomes a heating element, which flows heat into the capacitor element 201 via the capacitor terminal 203, so that the temperature of the capacitor element 201 is raised.

The extending member 204 is made of a material having high thermal conductivity, such as, for example, copper, and is connected to the DC-side bus bar 106. The extending member 204 is located between the capacitor case 200 and the capacitor element 201, and is formed toward the bottom of the capacitor case 200.

For this reason, the heat concentrated on the capacitor terminal 203 also flows to the extending member 204, whereby the heat can be dispersed and the temperature of the capacitor element 201 can be suppressed from rising.

Since the extending member 204 does not need to be electrically connected to the capacitor element 201, it is not connected to the element electrode surface 202. An element flat surface 205 is a side surface of the capacitor element 201, and is a surface other than the element electrode surface 202.

Figure 3:
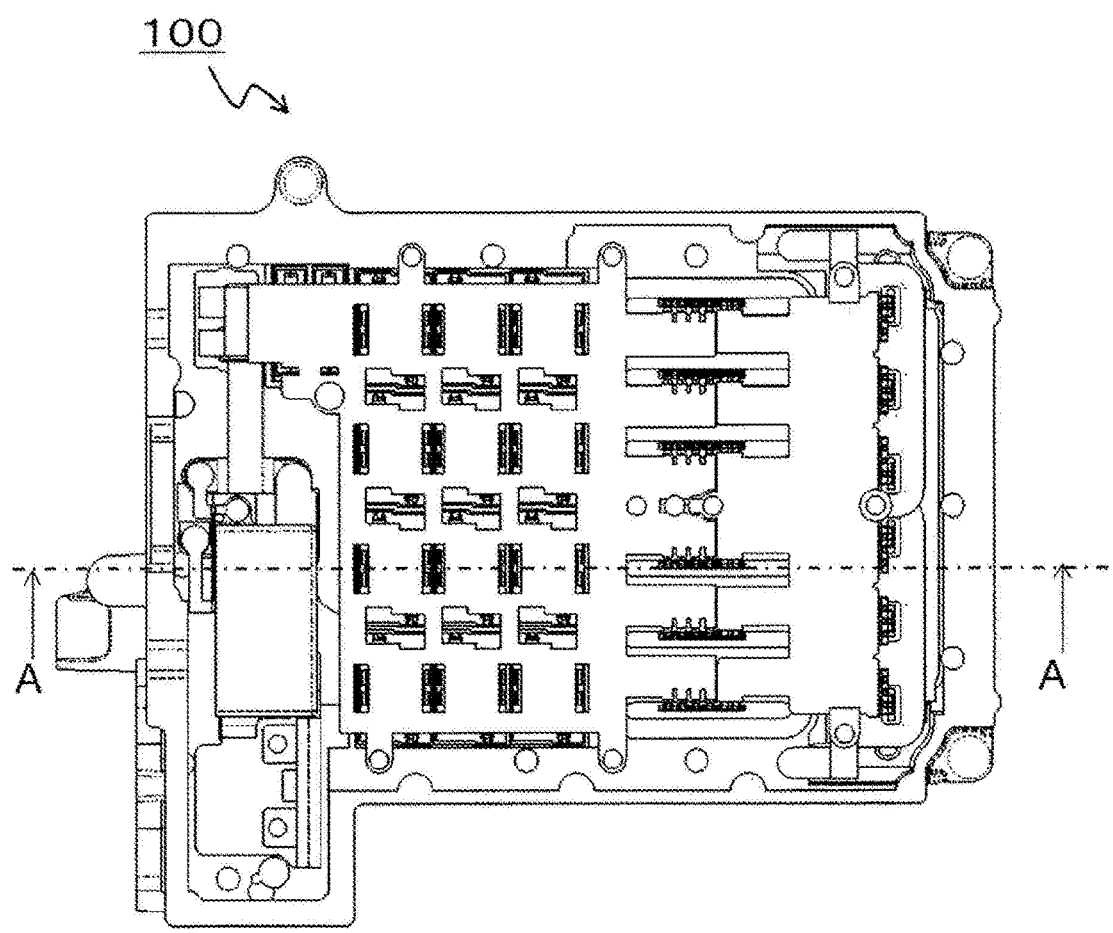
FIG. 3 is a top view of the power converter 100 according to the present embodiment.
Figure 4:
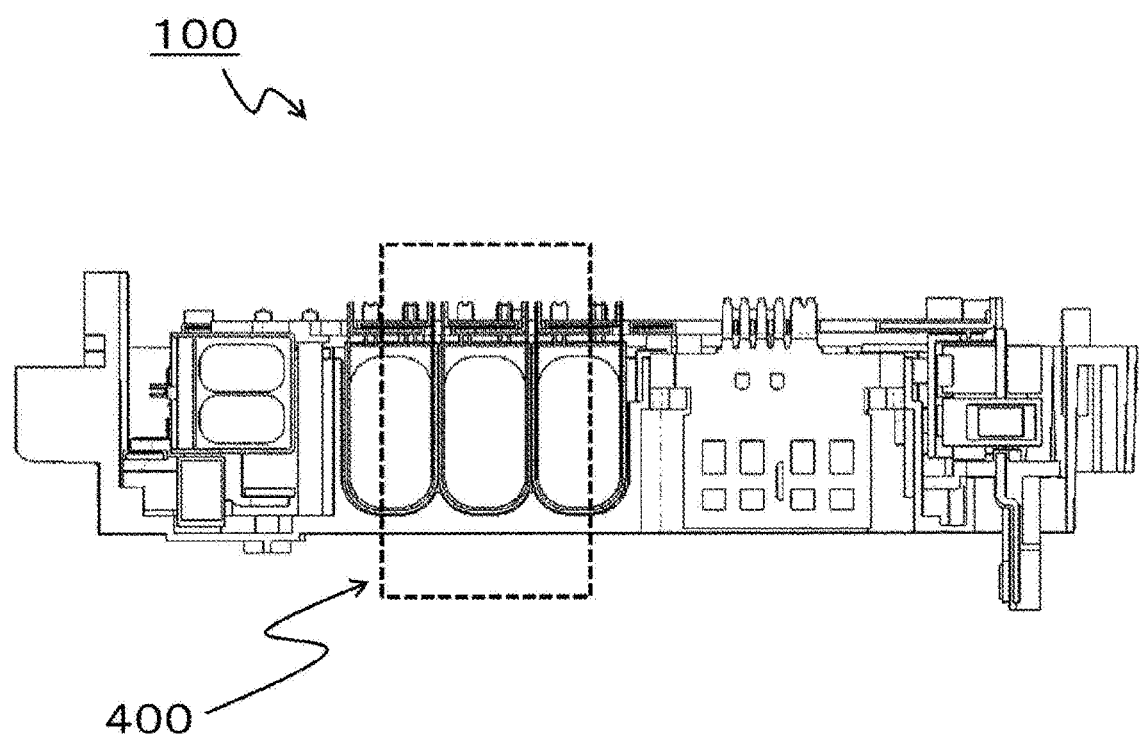
FIG. 4 is a cross-sectional view of the power converter 100, cut along A-A illustrated in FIG. 3.
Figure 5:
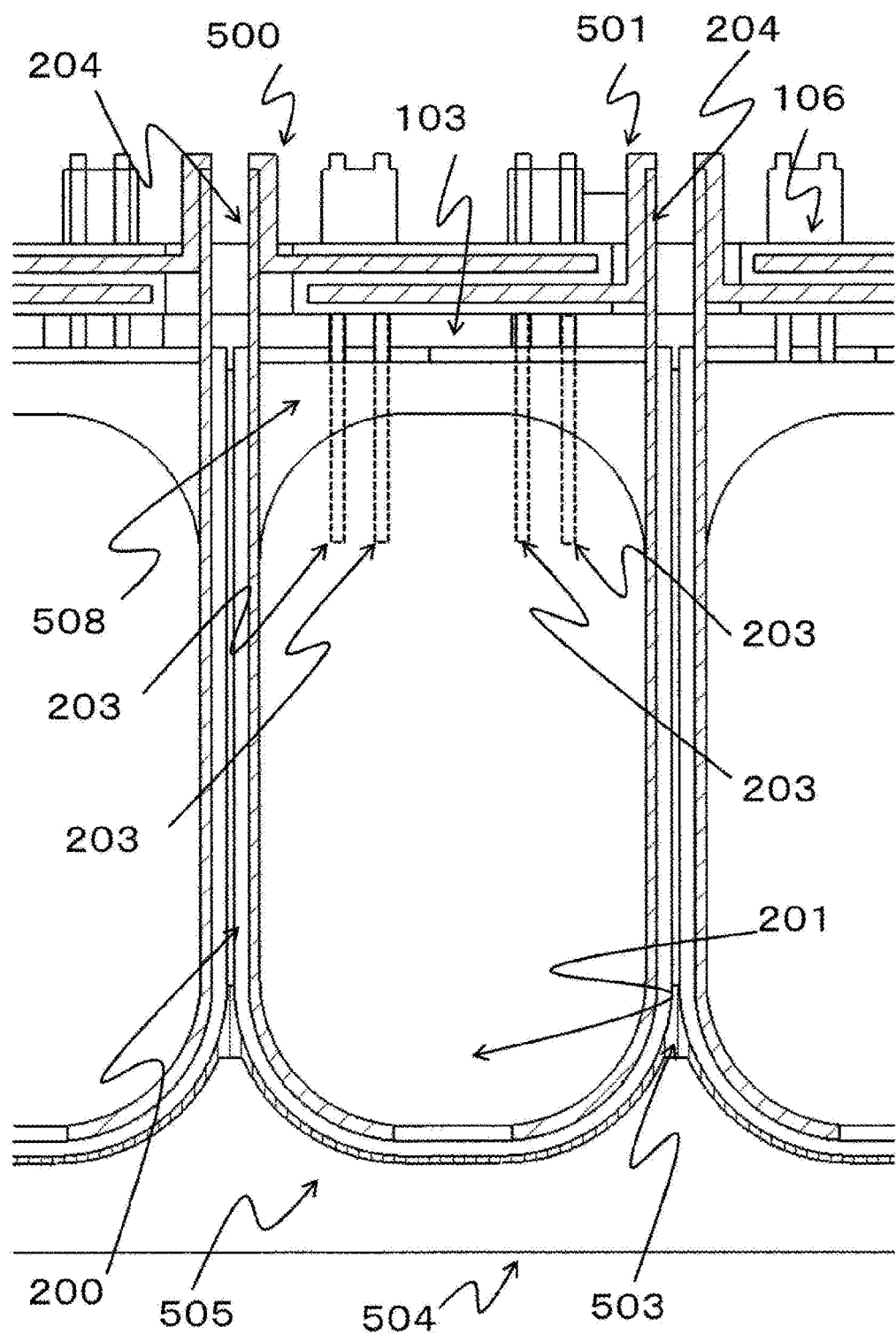
FIG. 5 is an enlarged view of a portion 400 surrounded by a dotted line in FIG. 4.

FIG. 3 is a top view of the power converter 100 according to the present embodiment. FIG. 4 is a cross-sectional view of the power converter 100, cut along A-A illustrated in FIG. 3. FIG. 5 is an enlarged view of a portion 400 surrounded by a dotted line in FIG. 4.

The smoothing capacitor 103 is fixed to a housing 505 with an adhesive 503. The capacitor element 201 is housed in the capacitor case 200 and sealed with an epoxy resin 508.

The DC-side bus bar 106 includes a negative-side bus bar 500 and a positive-side bus bar 501.

The heat generated in the DC-side bus bar 106 reaches a cooling surface 504 on the bottom surface of the housing 505 through two paths.

A first path is one that reaches the cooling surface 504 from the capacitor terminal 203 electrically connected to the negative-side bus bar 500 or the positive-side bus bar 501 of the DC-side bus bar 106 via the capacitor element 201.

A second path is one that reaches the cooling surface via the extending member 204 connected to the negative-side bus bar 500 or the positive-side bus bar 501.

In the first path, the capacitor element 201 having a high thermal resistance is the path, while in the second path, the extending member 204 having a low thermal resistance is the path.

Most of the heat generated in the DC-side bus bar 106 can be dissipated to the cooling surface 504 through the second path, so that the heat generation in the capacitor element 201 can be suppressed.

Figure 6:
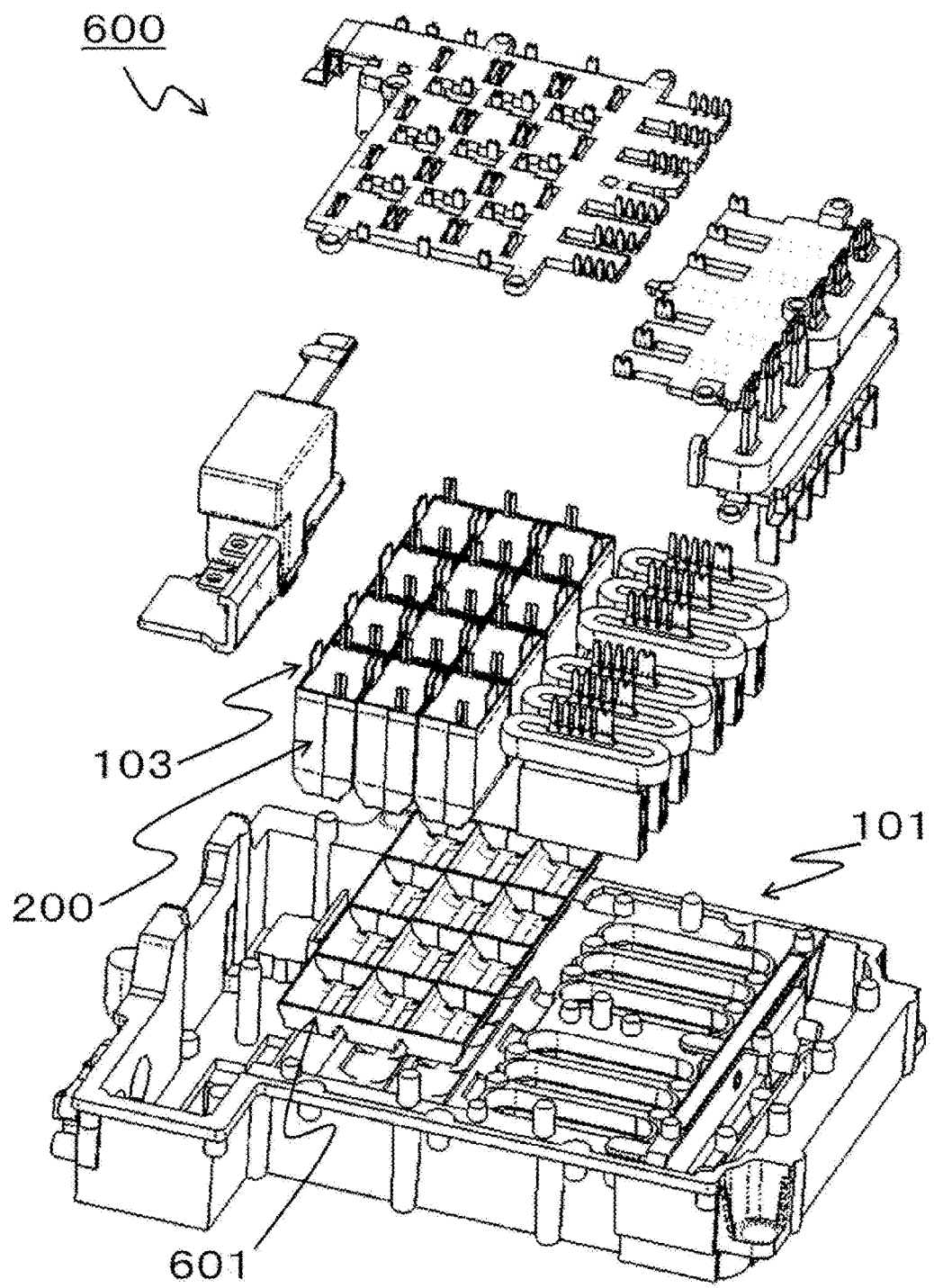
FIG. 6 is a development view of a power converter 600 according to another embodiment.

FIG. 6 is a development view of a power converter 600 according to another embodiment. Of the drawing numbers illustrated in FIG. 6, those having the same numbers as those in FIG. 1 have the same functions.

An interposed member 601 contacts the housing 101 and the capacitor case 200 of the smoothing capacitor 103. Thereby, heat transfer is improved since a member having high thermal conductivity, which has also the function of positioning the smoothing capacitor 103, is provided between the capacitor case 200 and the housing 101, so that heat can be further dissipated.

Figure 7:
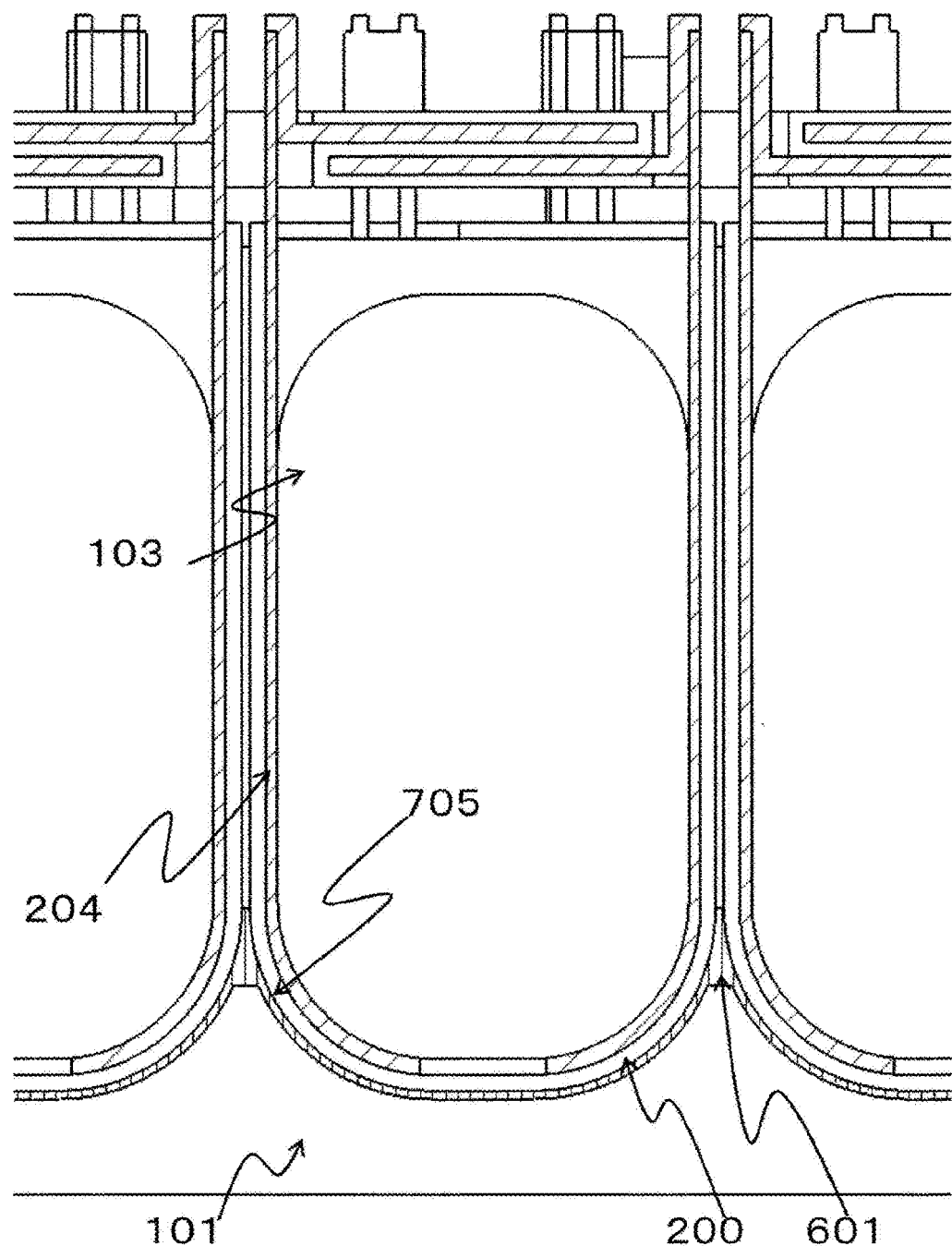
FIG. 7 is a partial cross-sectional view of the power converter 600 according to FIG. 6.

FIG. 7 is a partial cross-sectional view of the power converter 600 according to FIG. 6.

The housing 101 houses the capacitor case 200 of the smoothing capacitor 103. The interposed member 601 contacts the capacitor case 200 of the smoothing capacitor 103 and the housing 101.

The extending member 204 is extended to a region of the capacitor case 200 of the smoothing capacitor 103, the region facing a portion 705 where the capacitor case 200 and the interposed member 601 contact each other. Thereby, the distance between the interposed member 601 and the extending member 204 becomes small, and a heat dissipation effect is enhanced.

Figure 8:
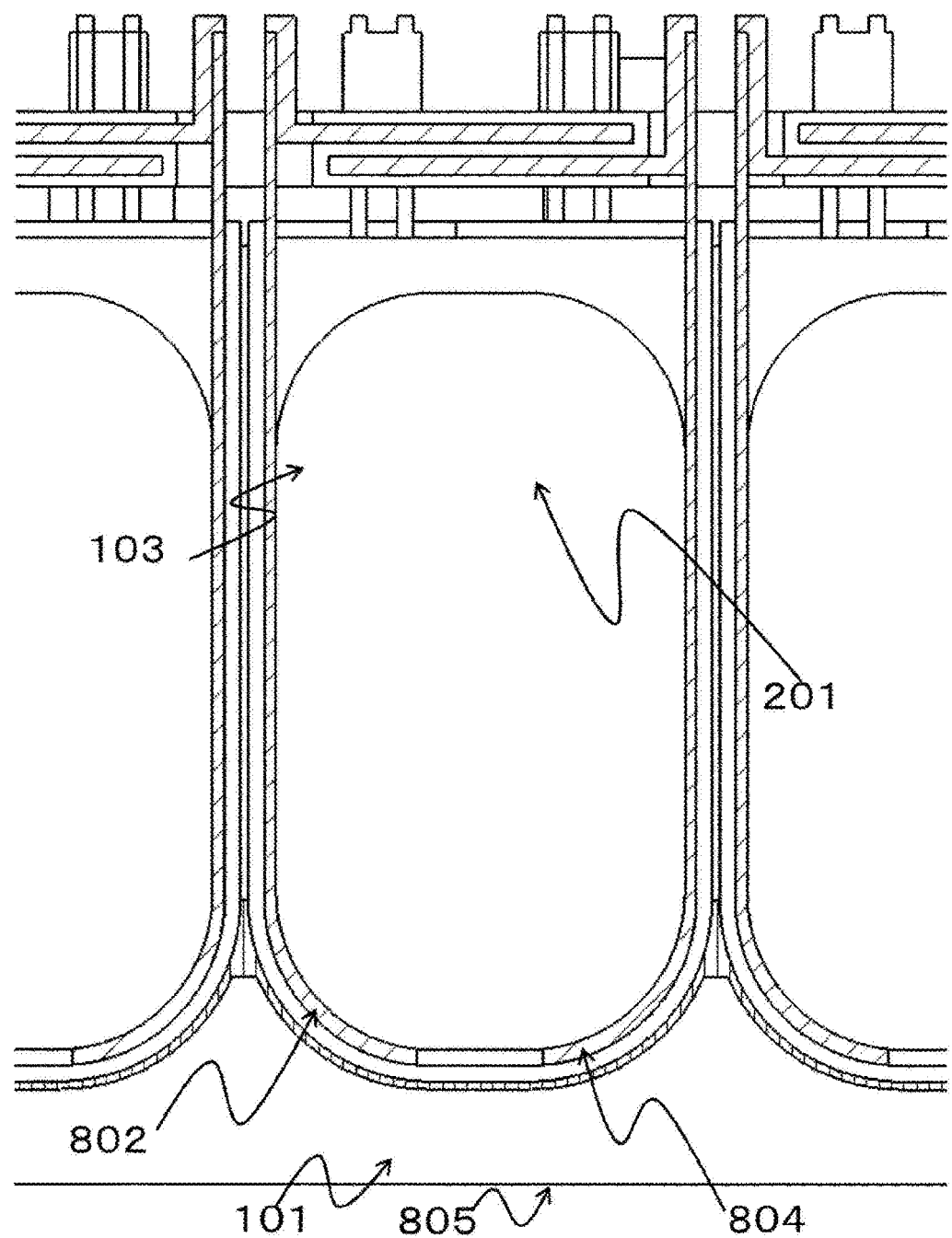
FIG. 8 is a cross-sectional view according to another embodiment of the power converter 600 of FIG. 6.

FIG. 8 is a cross-sectional view according to another embodiment of the power converter 600 of FIG. 6.

The smoothing capacitor 103 is arranged in the housing 101. An extending member 802 is extended to a region 804 sandwiched between the housing 101 and the capacitor element 201 of the smoothing capacitor 103. Thereby, the contact area with the lower portion of the capacitor element 201 increases, and the distance between a cooling surface 805 on the bottom surface of the housing 101 and the extending member 802 becomes small, so that a heat dissipation effect is enhanced.

Figure 9:
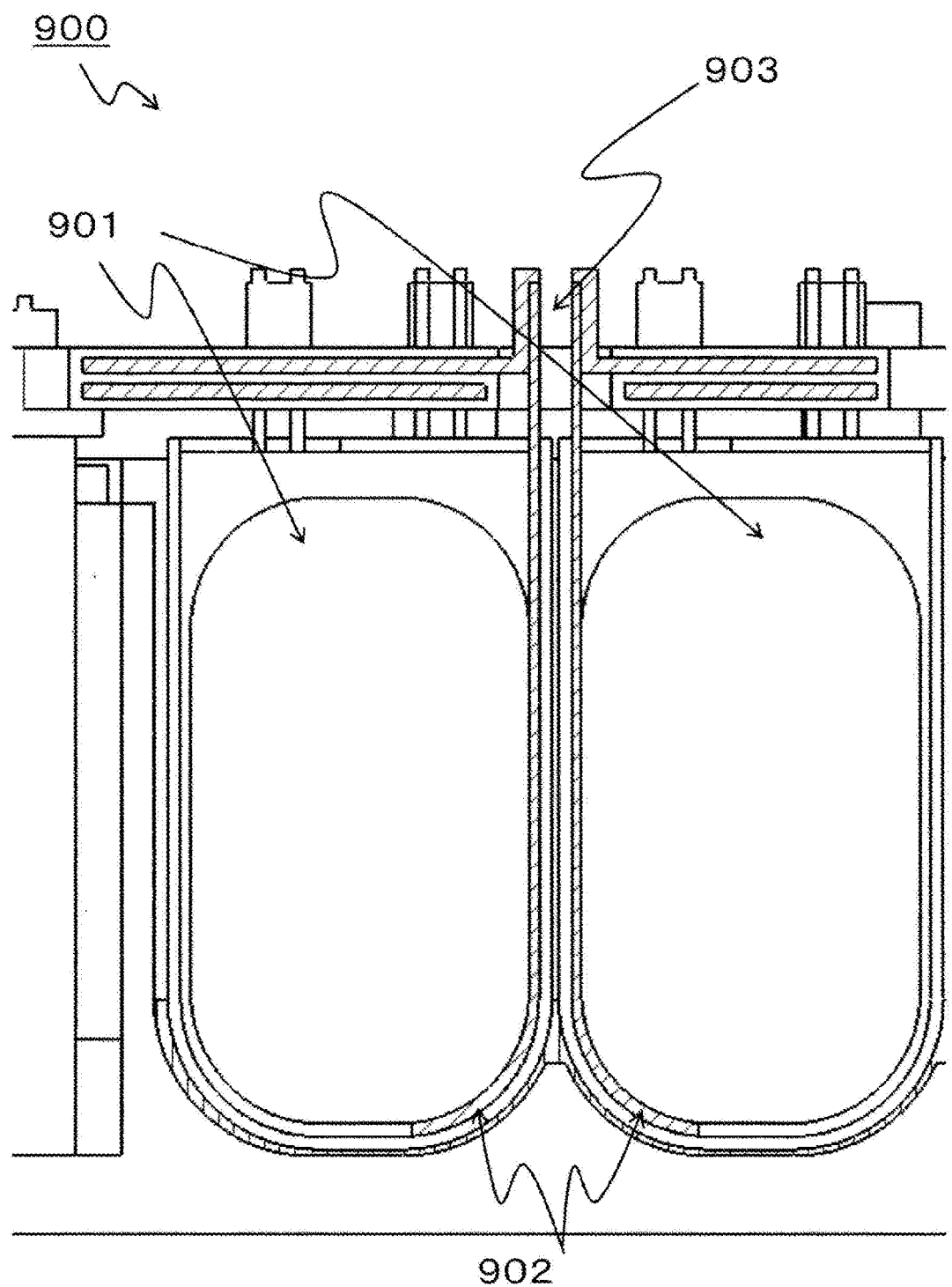
FIG. 9 is a cross-sectional view of a power converter 900 according to another embodiment.

FIG. 9 is a cross-sectional view of a power converter 900 according to another embodiment.

A plurality of capacitor elements 901 are provided. An extending member 902 is provided for each of the plurality of capacitor elements 901, and each of the plurality of extending members 902 is arranged in a space 903 between the plurality of capacitor elements 901. Thereby, heat can be dissipated from the space 903 where heat easily accumulates, and a rise in temperature can be suppressed.

Figure 10:
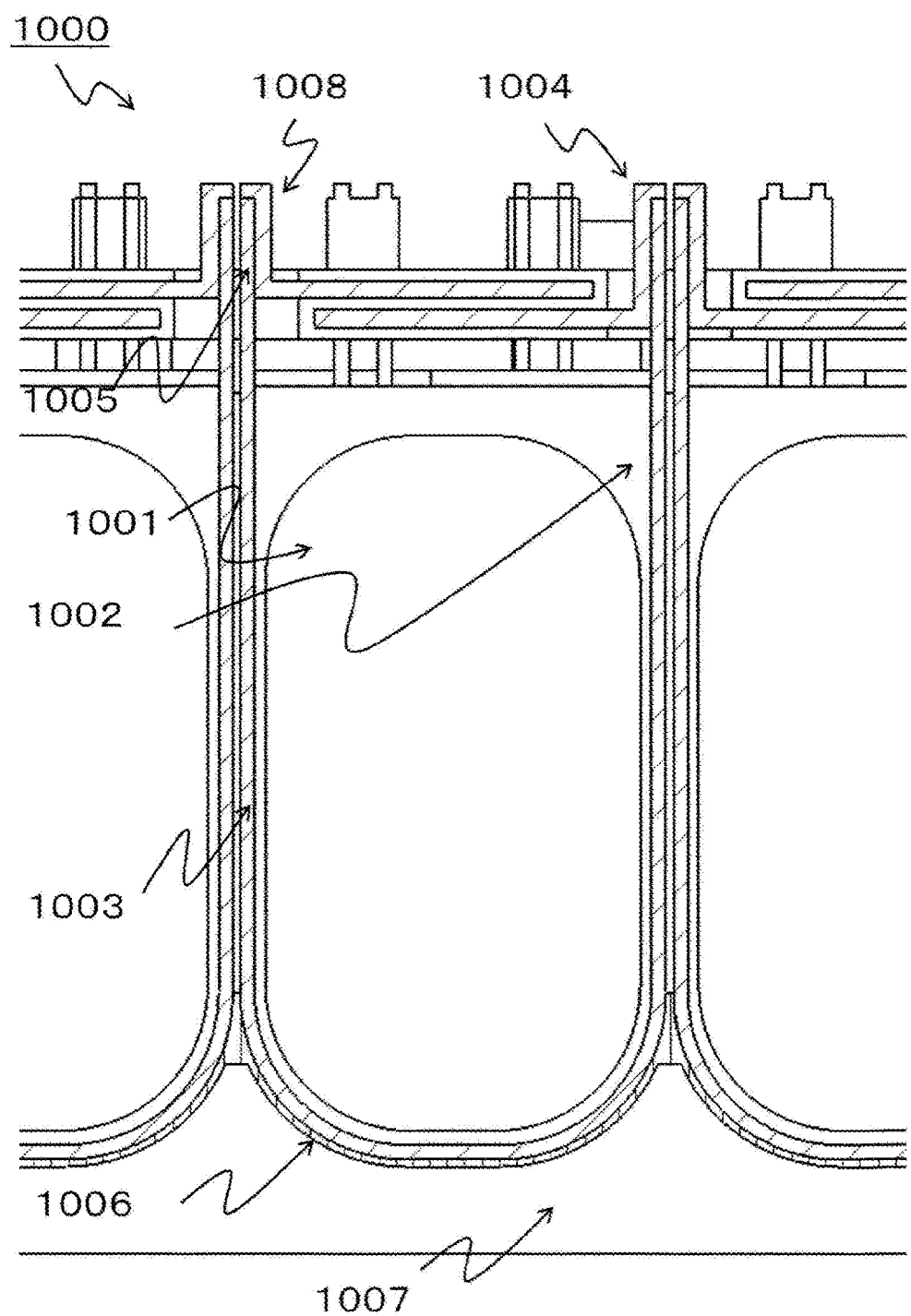
FIG. 10 is a cross-sectional view of a power converter 1000 according to another embodiment.

FIG. 10 is a cross-sectional view of a power converter 1000 according to another embodiment.

A capacitor element 1001 is in a capacitor case 1003, and is sealed with an epoxy resin 1002.

An extending member 1005 according to the present embodiment is connected to the capacitor case 1003, and is configured as part of the capacitor case 1003. The extending member 1005 may be formed integrally with the capacitor case 1003. The extending member 1005 contacts a negative-side bus bar 1008 and a positive-side bus bar 1004. An adhesive 1006 fixes the capacitor case 1003 to a housing 1007.

The heat generated in the negative-side bus bar 1008 and the positive-side bus bar 1004 reaches the housing 1007 via the extending member 1005 and the capacitor case 1003, and is dissipated to a cooling unit on the bottom surface of the housing 1007. Thereby, a high improvement in a heat dissipation property, via the extending member 1005 and the capacitor case 1003, can be achieved.

Figure 11:
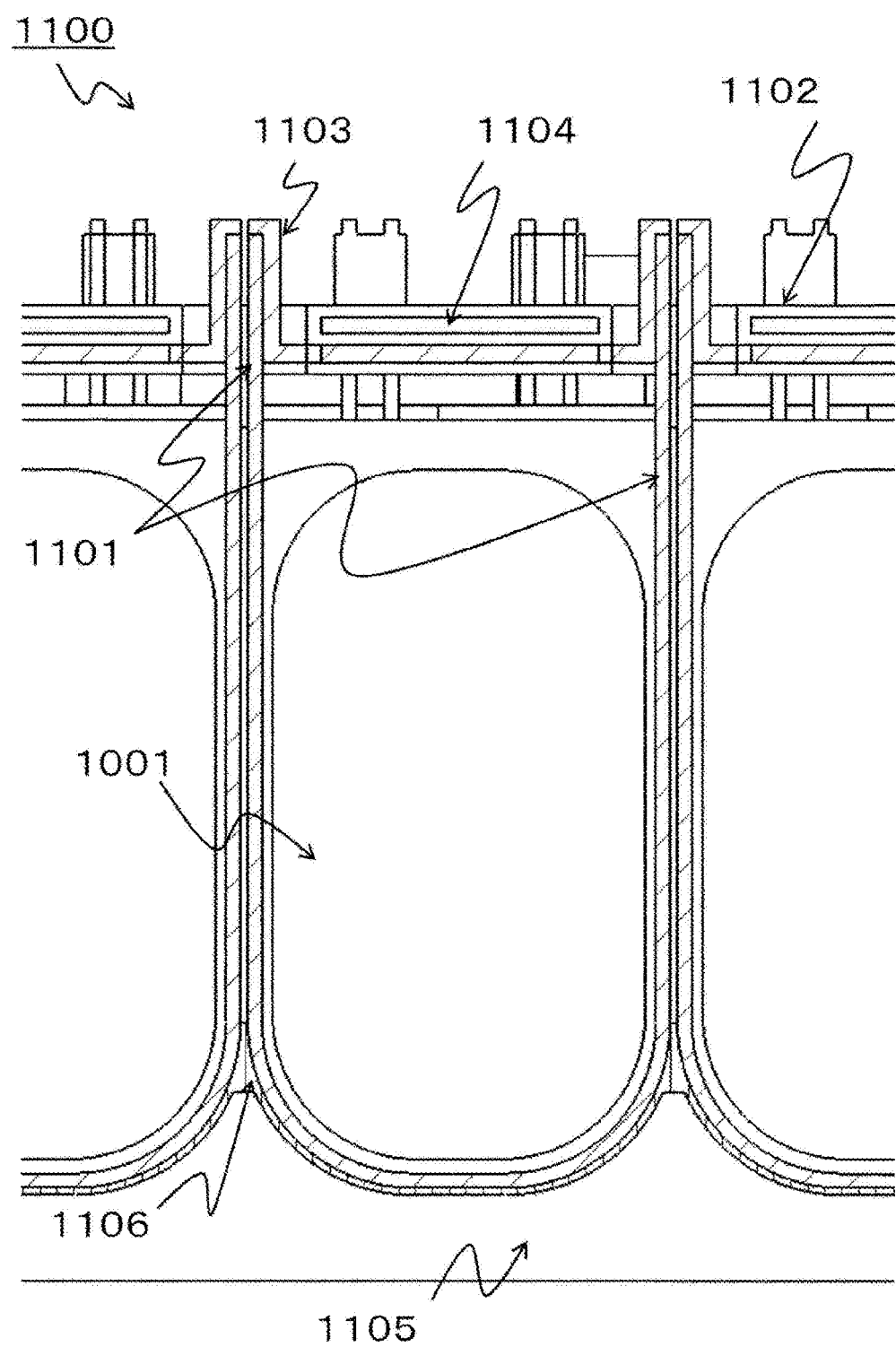
FIG. 11 is a cross-sectional view of a power converter 1100 to be used in another embodiment.

FIG. 11 is a cross-sectional view of a power converter 1100 to be used in another embodiment.

A plurality of extending members 1101 according to the present embodiment are provided. A DC-side bus bar 1102 includes a negative-side bus bar 1103 and a positive-side bus bar 1104.

The plurality of extending members 1101 are connected to the bus bar on either polarity side. For example, they are connected to the negative-side bus bar 1103. The heat generated in the DC-side bus bar 1102 reaches a housing 1105 via the extending member 1101 and an interposed member 1106, and is dissipated to a cooling unit on the bottom surface of the housing 1105.

Thereby, heat can be dissipated more efficiently via the extending member 1101, even if a heat dissipation path for the negative-side bus bar 1103 is difficult to secure, for example, because the negative-side bus bar 1103 is sandwiched between the positive-side bus bar 1104 and the capacitor element 1001.

Figure 12:
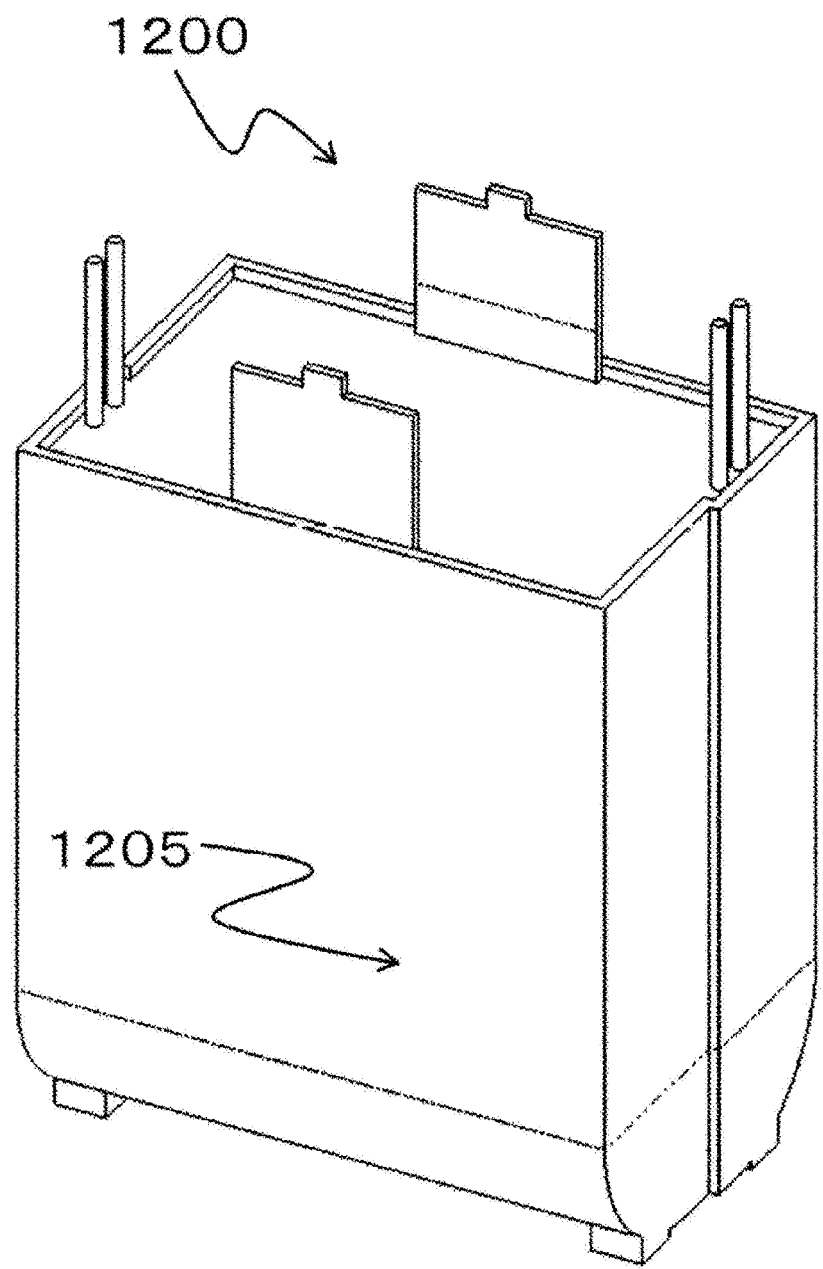
FIG. 12(a) is an overall perspective view of a smoothing capacitor 1200 that can be used in FIGS. 1 to 11.
FIG. 12(b) is a side view of the smoothing capacitor 1200.
FIG. 12(c) is a cross-sectional view of the smoothing capacitor 1200 viewed from the direction of the arrow on the plane BB in FIG. 12(b).
Figure 12:
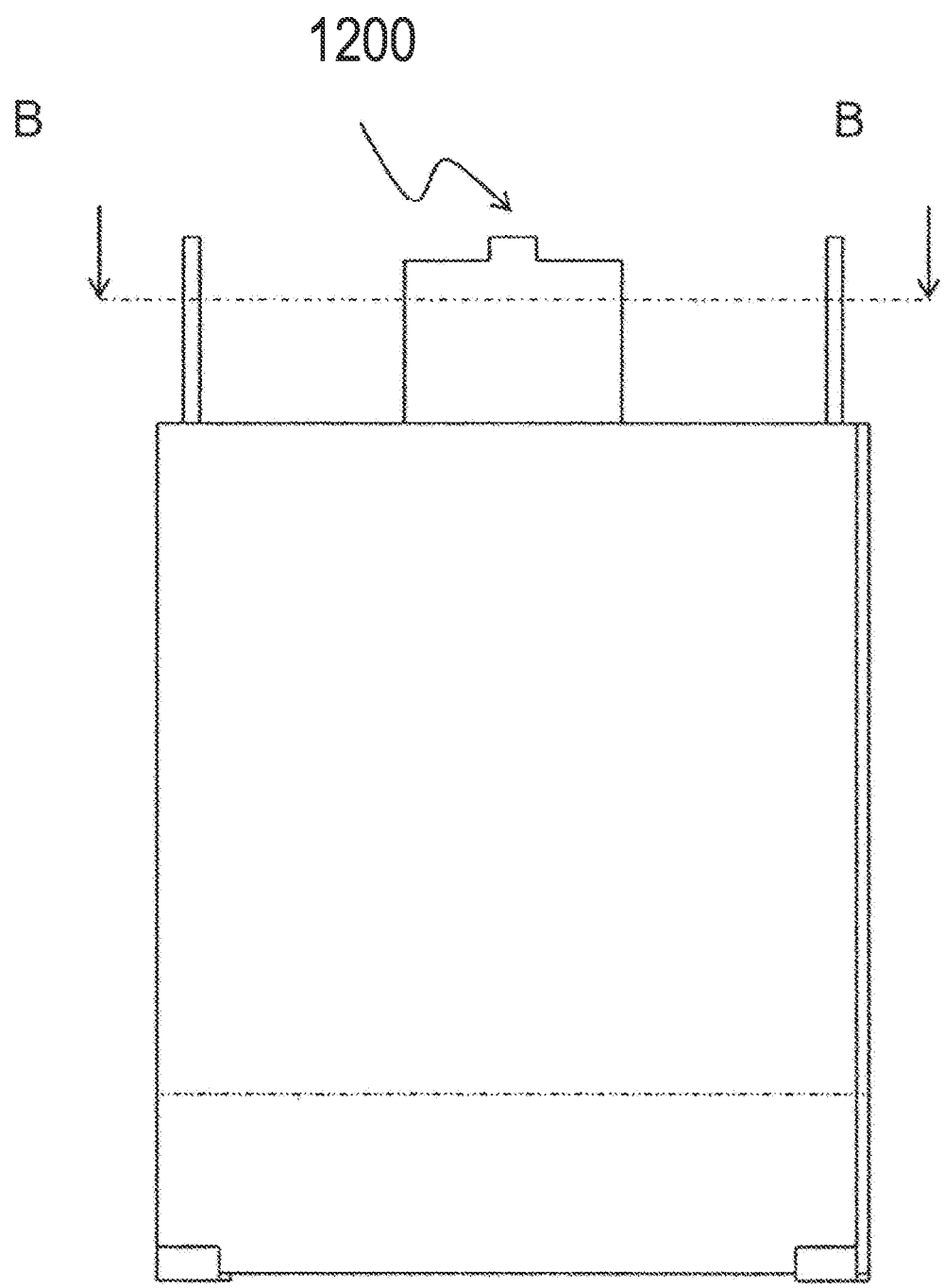
Figure 12:
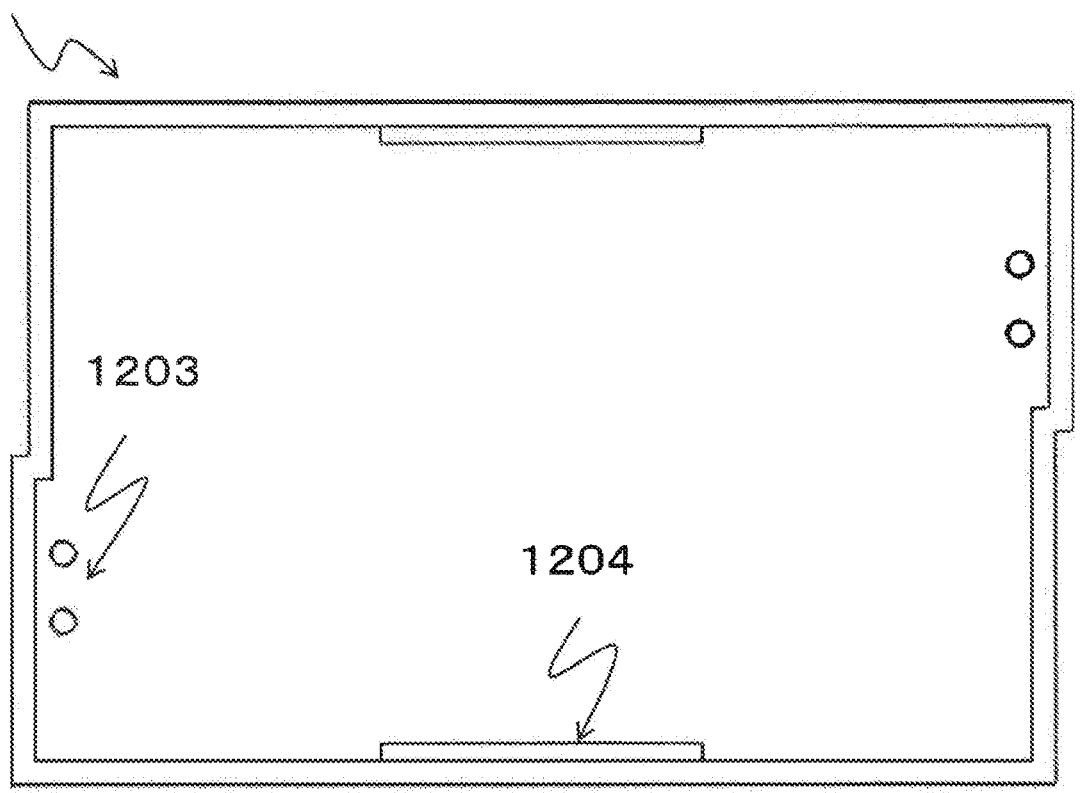

FIG. 12(a) is an overall perspective view of a smoothing capacitor 1200 that can be used in FIGS. 1 to 11. FIG. 12(b) is a side view of the smoothing capacitor 1200. FIG. 12(c) is a cross-sectional view of the smoothing capacitor 1200 viewed from the direction of the arrow on the plane B-B in FIG. 12 (b).

When viewed from the opening surface side of a capacitor case 1205, the cross section of a capacitor terminal 1203 and the cross section of an extending member 1204 can be confirmed, as illustrated in FIG. 12(c).

The cross-sectional area of the extending member 1204 is formed to be larger than the cross-sectional area of the capacitor terminal 1203. Thereby, the heat to flow into the cross section of the capacitor terminal 1203 can be suppressed, and heat can be dissipated from the bottom surface of the capacitor case 1205 to the cooling surface on the bottom surface of the housing by increasing the heat to flow into the cross section of the extending member 1204.

REFERENCE SIGNS LIST 100 power converter
101 housing
102 power semiconductor circuit unit
103 smoothing capacitor
104 power supply-side terminal
105 AC-side bus bar
106 DC-side bus bar
107 cooling surface
200 capacitor case
201 capacitor element
202 element electrode surface
203 capacitor terminal
204 extending member
205 element flat surface
400 portion
500 negative-side bus bar
501 positive-side bus bar
503 adhesive
504 cooling surface
50, 5 housing
508 epoxy resin
600 power converter
601 interposed member
705 portion
802 extending member
804 region
805 cooling surface
901 capacitor element
902 extending member
903 space
1001 capacitor element
1002 epoxy resin
1003 capacitor case
1004 positive-side bus bar
1005 extending member
1006 adhesive
1007 housing
1008 negative-side bus bar
1101 extending member
1102 DC-side bus bar
1103 negative-side bus bar
1104 positive-side bus bar
1105 housing
1106 interposed member
1200 smoothing capacitor
1203 capacitor terminal
1204 extending member
1205 capacitor case

The invention claimed is:

1. A power converter comprising:
a power semiconductor circuit unit configured to convert DC power into AC power;
a capacitor element configured to smooth the DC power;
a DC-side bus bar configured to transmit the DC power;
a capacitor terminal that is connected to an electrode surface of the capacitor element and to the DC-side bus bar; and
a case that forms a capacitor housing portion for housing the capacitor element, wherein
the DC-side bus bar has:
a power supply-side terminal;
a main body portion that is arranged at a position facing a cooling surface of a bottom of the capacitor housing portion with the capacitor element interposed between the main body portion and the cooling surface of the bottom of the capacitor housing portion; and
an extending member that forms a thermally conductive path between the case and the capacitor element from the main body portion toward the cooling surface of the bottom of the capacitor housing portion, and that does not contact or form a thermally conductive path to the electrode surface,
wherein the extending member is formed of metal and is separated from the capacitor housing portion by an adhesive, and
wherein a cross-sectional area of the extending member is formed to be larger than a cross-sectional area of the capacitor terminal.

2. The power converter according to claim 1, comprising:
a housing that arranges the case; and
an interposed member that contacts the case and the housing.

3. The power converter according to claim 2, comprising:
a housing that arranges the case; and
an interposed member that contacts the case and the housing, wherein
the extending member is extended to a region facing a portion of the case where the portion contacts the interposed member.

4. The power converter according to claim 3, wherein
the extending member is extended to a region between the capacitor element and the housing.

5. The power converter according to claim 1, wherein:
a plurality of the capacitor elements are provided;

the extending member is provided for each of the plurality of the capacitor elements; and each of a plurality of the extending members is arranged between the plurality of the capacitor elements.

6. The power converter according to claim 1, wherein:

a plurality of the extending members are provided;

the DC-side bus bar includes a positive-side bus bar and a negative-side bus bar; and the plurality of the extending members are connected to either the positive-side bus bar or the negative-side bus bar.

7. The power converter according to claim 2, wherein:

the interposed member tapers from a first width at a position where the interposed member contacts the case and at which a distance between the interposed member and the extending member is a first distance, to a second width at a position at which the distance between the interposed member and the extending member is a second distance which is smaller than the first distance.

* * * * *